(12) United States Patent
Kildishev et al.

(10) Patent No.: US 10,067,326 B2
(45) Date of Patent: Sep. 4, 2018

(54) ELECTROMAGNETIC WAVE CONCENTRATOR AND ABSORBER

(71) Applicant: Purdue Research Foundation, West Lafayette, IN (US)

(72) Inventors: Alexander V. Kildishev, West Lafayette, IN (US); Evgueni E. Narimanov, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 439 days.

(21) Appl. No.: 14/987,194

(22) Filed: Jan. 4, 2016

(65) Prior Publication Data

US 2016/0147052 A1    May 26, 2016

Related U.S. Application Data

(62) Division of application No. 13/190,904, filed on Jul. 26, 2011, now Pat. No. 9,228,761.

(60) Provisional application No. 61/367,706, filed on Jul. 26, 2010, provisional application No. 61/510,607, filed on Jul. 22, 2011.

(51) Int. Cl.
*G02B 19/00* (2006.01)
*F24J 2/06* (2006.01)
*G01J 1/04* (2006.01)
*G01J 5/08* (2006.01)
*H01L 31/054* (2014.01)

(52) U.S. Cl.
CPC ............ *G02B 19/0042* (2013.01); *F24J 2/06* (2013.01); *G01J 1/04* (2013.01); *G01J 1/0407* (2013.01); *G01J 1/0422* (2013.01); *G01J 5/08* (2013.01); *G01J 5/0853* (2013.01); *G02B 19/0014* (2013.01); *G02B 19/0038* (2013.01); *G02B 19/0076* (2013.01); *H01L 31/054* (2014.12); *H01L 31/0543* (2014.12); *Y02E 10/44* (2013.01); *Y02E 10/52* (2013.01); *Y10T 29/49* (2015.01); *Y10T 428/24802* (2015.01); *Y10T 428/24942* (2015.01)

(58) Field of Classification Search
None
See application file for complete search history.

(56) References Cited

U.S. PATENT DOCUMENTS 5,936,777 A * 8/1999 Dempewolf ............ F24J 2/08
                                                         359/653

* cited by examiner

*Primary Examiner* — Gerard Higgins
(74) *Attorney, Agent, or Firm* — Purdue Research Foundation (57) ABSTRACT

An electromagnetic black hole may be fabricated as concentric shells having a permittivity whose variation is at least as great as an inverse square dependence on the radius of the structure. Such a structure concentrates electromagnetic energy incident thereon over a broad range of angles to an operational region near the center of curvature of the structure. Devices or materials may be placed in the operational region so as to convert the electromagnetic energy to electrical signals or to heat. Applications included solar energy harvesting and heat signature detectors.

20 Claims, 9 Drawing Sheets

ELECTROMAGNETIC WAVE CONCENTRATOR AND ABSORBER

CROSS REFERENCE

The present application is a divisional of U.S. application Ser. No. 13/190,904, filed Jul. 26, 2011, which claims the benefit of priority to U.S. Provisional No. 61/367,706, filed Jul. 26, 2010, and to U.S. Provisional No. 61/510,607, filed Jul. 22, 2011, the disclosures of which are hereby incorporated by reference.

GOVERNMENT SUPPORT

This invention was made with government support under W911 NF-06-1-0377 awarded by the U.S. Army Research Office. The government has certain rights in the invention.

TECHNICAL FIELD

The present application may relate to the use of materials for managing the propagation characteristics of electromagnetic waves incident thereon.

The present application may relate to the use of materials for managing the propagation characteristics of electromagnetic waves incident thereon.

BACKGROUND

While the theoretical concept of "black body" radiation has proved remarkably useful for modern science and engineering, from its role in the creation of quantum mechanics to its applications to actual light sources, few actual materials or structures come close to 100% absorption for all angles over a broad bandwidth. Even though many applications would greatly benefit from such a perfect absorber, from cross-talk reduction in optoelectronic devices to thermal light emitting sources to solar light harvesting, as examples, a perfect absorber has remained elusive. Herein, the term "black hole" simply refers to the highly efficient "capture" of the electromagnetic energy incident on the device, and does not imply any profound analogy to General Relativity.

SUMMARY

Disclosed herein is an approach to highly efficient electromagnetic energy absorption, based on the materials having particular spatial dependencies of the permittivity. The term "absorption" may be understood in this context to describe a situation where the electromagnetic energy enters a structure, and does not come out. The incident energy may, however, be converted to other energy forms; for example: to electrical energy by photodetectors, or to heat by an absorbing material located therein.

The system and method employs the control of the local electromagnetic response of the material of the structure, with a resulting "effective permittivity potential" that determines the dynamics of the wave propagation in the structure so as to form an effective "black hole." That is, the electromagnetic energy goes in and does not come out, even if the structure itself were to be essentially lossless. In an ideal case, all of the energy is trapped in the interior, or is converted to another energy form. The device, in some configurations, exhibits efficient omnidirectional energy capture over a broad spectral bandwidth.

In an aspect, the system includes a material having a spatial variation of permittivity selected such the variation of the permittivity in a direction along the local radius of curvature of the system is at inversely proportional to at least the square of the local radius of curvature.

In another aspect, the system may comprise a plurality of contiguous thin shells each shell having a permittivity. The shells may be arranged about a center of curvature so that the variation of permittivity of the shells with a radial distance from a center of curvature is at least an inverse square radial function.

A central region of the structure may have a device such as a photodetector for converting the electromagnetic energy to an electrical signal, or an absorbing medium for converting the electromagnetic energy to heat.

DESCRIPTION

Exemplary embodiments may be better understood with reference to the drawings, but these embodiments are not intended to be of a limiting nature.

Figure 1:
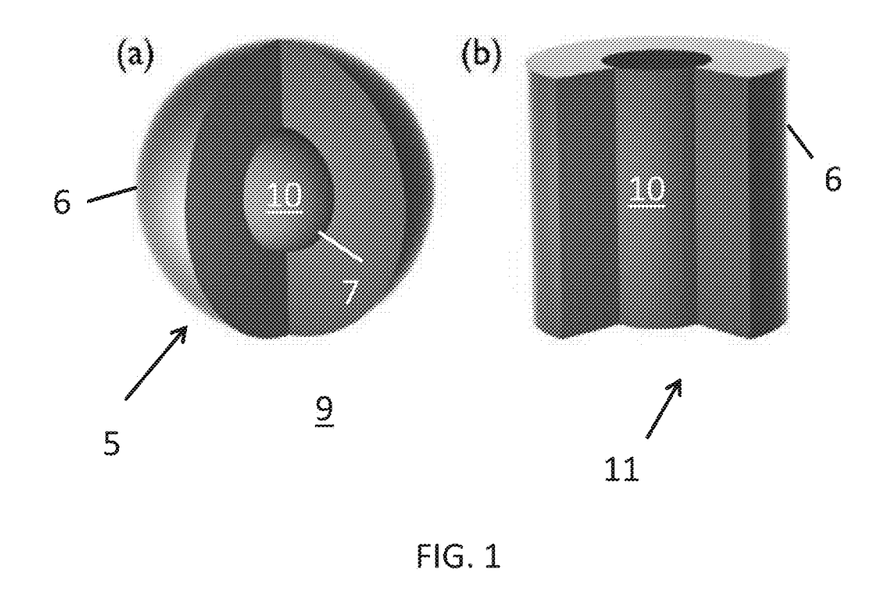
FIG. 1 shows (A) cut-out views of the spherical and (B) cylindrical optical "black holes." The core represents the "payload" of the device (e.g., a detector, a photovoltaic element, or the like)

To achieve substantially equal performance at any incidence angle direction, a spherically symmetric shell, for example, may be used, as shown in FIG. 1A. The shell 5 may have an outer radius $R_s$, 6, and an inner radius $R_c$, 7, with the radial variation in the shell permittivity $\in(r)$ matching those of the outer medium 9 and of the internal core 10 at the corresponding interfaces $$\varepsilon = \begin{cases} \varepsilon_c + i\gamma, & r < R_c, \\ \varepsilon(r), & R_c < r < R, \\ \varepsilon_0, & r > R, \end{cases} \quad (1)$$

where the core radius $R_c = \sqrt{\in_0/\in_c}$. Alternatively, cylindrical geometry 11 may be used and this is also easy to exactly analyze formally (see FIG. 1B). Other device shapes are possible and may be evaluated with numerical methods. A person of skill in the art will be able to formulate such cases and use commercially available software packages to design the structures and materials properties, after having been made aware of the teachings herein.

When the materials forming the shell are essentially non-magnetic, the refractive index is:

$$n = \sqrt{\in}$$

The inner core 10 may represent the location of the "payload" of the device: e.g., a photovoltaic system for recovering the trapped light energy for solar power applications, or a photodetector, or absorbing (lossy) material, such as a highly doped semiconductor (e.g., silicon, germanium, gallium arsenide, or the like). Similarly, for applications where a waveguide propagation mode may be used, a cylindrical equivalent (see FIG. 1B) may be considered.

A desired radial variation in the permittivity of a composite shell structure may be achieved by, for example, changing the relative volume fractions of the component materials. The structure may be fabricated using thin layers of differing material properties, or other known or to be developed techniques for making a structure with the specified spatial electromagnetic properties. That is, it is the spatial variation of the characterizable electromagnetic properties of the materials comprising the structure that determine the resultant optical performance. These characteristics may be obtained with a variety of materials, or metamaterials, depending on the operating wavelength, bandwidth of operation and other device attributes.

The permittivity may vary spatially depending on the topological structure of the structure which may be, for example, a composite structure, a layered or lamellar system, a fractal material mixture, or other arrangement. The permittivity may generally be a monotonic function and thus the desired variation in $\in(r)$ can be realized with a suitable radial dependence of the component densities. However this is not required.

Herein, it is convenient to use the relative permittivity where numerical examples are given. The relative permittivity is the ratio of the material permittivity to that of a vacuum. As this would be apparent to a person of skill in the art, the modifier "relative" is often omitted.

The specific materials used may depend on the wavelength of operation and the bandwidth of the device, and may be selected based on practical considerations of fabrication and cost, while conforming to the electromagnetic properties described herein. Where the electromagnetic properties of the materials are described, a person of skill in the art will understand that the materials themselves may be composite materials where selected materials having differing electromagnetic properties are combined on physical scales such that the measurable electromagnetic properties of the composite material are based on the sizes and shapes of the component materials and the electromagnetic properties of the individual components.

Often, the material properties may be predicted by using an effective medium model. Certainly, the properties may be measured using appropriate measurement techniques for bulk materials so as to characterize the material at a wavelength or a range of wavelengths. A useful broadband material is silicon, which has a low loss transmission window over the range $1 < \lambda < 10$ μm, and again at longer wavelengths. Other materials which may be used at optical, near infrared and infrared wavelengths may be, for example, germanium, gallium arsenide, and silicon carbide.

Matching the permittivity of the system to a low-refractive-index environment such as air may require metallic components (with $\in_m < 0$) in the composite forming the outer portion of the structure, with the concomitant losses leading to a nonzero imaginary part of $\in(r)$. On the other hand, if the permittivity of the outer medium $\in_0 > 1$, an all-dielectric design is possible. Typically the permittivity of the material at the outer boundary of the structure may be greater than unity, and conventional impedance matching layers (e.g., thin films) may be used for impedance matching to the external environment as is the case for conventional optical lenses and other electromagnetic structures.

To incorporate the application-dependent inner core, such as a photodetector, the dimensions of the structure may significantly exceed the light wavelength $$R_c \geq \lambda, R \gg \lambda \quad (2)$$

The size of a structure may be substantial, and be capable of enclosing conventional optical, electrical or other components.

In this scale size regime, semiclassical electromagnetic analysis may be used and leads to a clear physical picture of the wave dynamics and an accurate quantitative estimation of the performance. An exact is analysis presented subsequently.

For spherically and cylindrically symmetric distributions of the permittivity $\in(r)$, the effective Hamiltonian describing the electromagnetic wave propagation is:

$$H = \frac{P_r^2}{2\varepsilon(r)} + \frac{m^2}{2\varepsilon(r)r^2}, \quad (3)$$

where $P_r$ is the radial momentum and m is the total angular momentum for a spherical system, or the projection thereof on a cylinder axis for the cylindrical version. The form of the classical equations of motion corresponding to the Hamiltonian outside the core, $r > R_c$, are the same as those of a point particle of unitary mass in a central potential field:

$$V_{eff}(r) = \frac{1}{2}\left(\frac{\omega}{c}\right)^2 [\varepsilon_0 - \varepsilon(r)], \quad (4)$$

where c is the speed of light in a vacuum and ω is the radian frequency.

For a radial permittivity profile described by $e(r) \propto 1/r$, the properties may be considered as an optical analog to the Kepler problem in celestial mechanics. A solution of the Hamiltonian equations yields the optical ray trajectories in polar coordinates $$\Phi(r) = \Phi_0 + \int_{m/r_1}^{m/r} \frac{d\xi}{\sqrt{C_0 \varepsilon\left(\frac{m}{\xi}\right) - \xi^2}}, \quad (5)$$

where the constants $r_1$, $\phi_0$ and $C_0$ are set by the initial conditions of the incident light ray on the external surface.

When the effective potential $V_{\mathit{eff}} \propto \varepsilon_0 - \varepsilon$ is sufficiently "attractive," the corresponding ray trajectories experience a fall onto the core of the system. Representing the permittivity as:

$$\varepsilon(r) = \varepsilon_0(1 + \Delta\varepsilon) \quad (6)$$

where $\Delta\varepsilon$ may be represented by a power law variation, $\Delta\varepsilon \sim 1/r^n$, any value of $n \geq 2$ leads to such a "fall" Into the core region. That is, the variation of the permittivity with radius is at least as great as an inverse square function of the radial distance.

Thus, an example of a family of optical "black holes" may be characterized by having a variation of permeability given by (6) with:

$$\Delta\varepsilon_n(r) = \begin{cases} 0, & r > R, \\ \left(\frac{R}{r}\right)^n, & r < R, \end{cases} \quad (7)$$

For this class of permeability variation for the ray trajectories within the "event horizon," $r \leq R$, one obtains the result:

$$r(\phi) = R \begin{cases} \left[\dfrac{\cos\left(\frac{n-2}{2}(\phi - \phi_0)\right)}{\cos\left(\frac{n-2}{2}(\phi_R - \phi_0)\right)}\right]^{\frac{2}{n-2}}, & n \neq 2 \\ \exp\left[-\sqrt{\dfrac{mR^n}{C_0} - 1}(\phi - \phi_0)\right], & n = 2 \end{cases} \quad (8)$$

where $\phi_R$ is an arbitrary constant, determined from the initial conditions of a particular trajectory.

Figure 2:
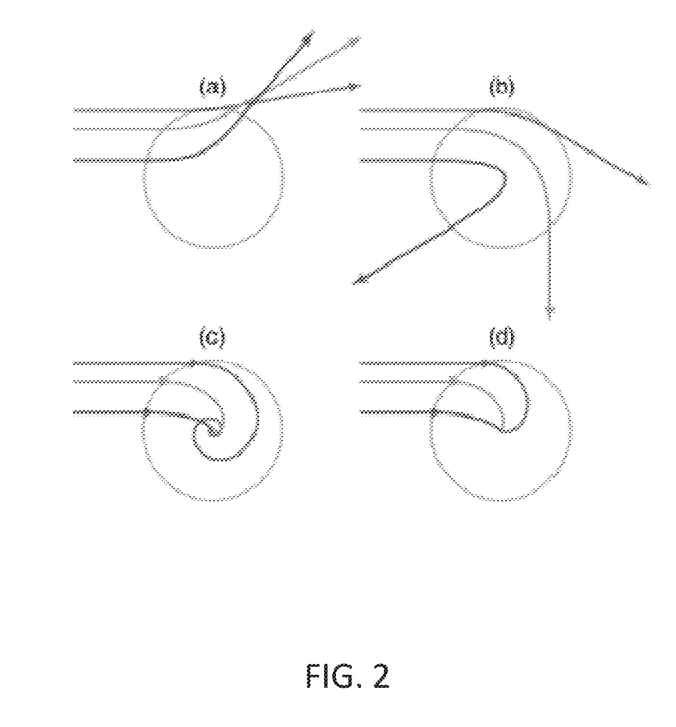
FIG. 2 shows ray trajectories in systems with the permittivity defined by Eq. 7 for (A) n=−1, (B) n=1, (C) n=2, and (D) n=3; the core radius is assumed to be infinitesimal.

Representative trajectories corresponding to different orders n are shown in FIG. 2. Higher order variations of the radial permeability are also possible. For purposes of analysis and understanding, examples are shown which use the smallest order of the variation which captures the incident rays: n=2.

In an example where the materials and fabrication method chosen results in permittivity values in the range $\varepsilon_0 < \varepsilon < \varepsilon_c$, the black hole may be expressed as:

$$\varepsilon(r) = \begin{cases} \varepsilon_0, & r > R, \\ \varepsilon_0 \left(\frac{R}{r}\right)^2, & R_c < r < R, \\ \varepsilon_c + i\gamma, & r < R_c. \end{cases} \quad (9)$$

where the core radius $R_c$ is:

$$R_c = R \sqrt{\frac{\varepsilon_0}{\varepsilon_c}}, \quad (10)$$

Figure 3:
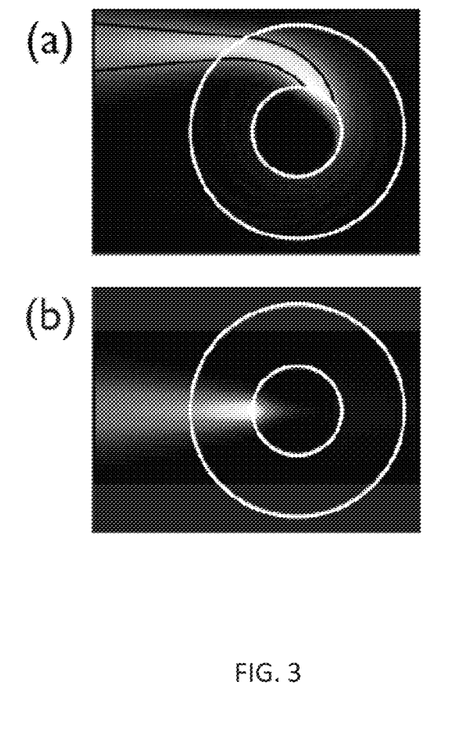
FIG. 3 shows a Gaussian beam incident on the "black hole" (A) off-center and (B) on-center. Note the lack of any visible reflection which would be manifested by the interference fringes between incident and reflected light. The solid black lines in (A) show the classical ray trajectories. The "black hole" is formed by n-doped silicon-silica glass composite with the inner radius of 8.4 μm and the outer radius of R=20 μm. The free-space incident light wavelength is λ=1.5 μm.

FIG. 3 shows a full wave numerical calculation (using COMSOL Multiphysics, from COMSOL, Burlington, Mass.)) of the light guidance in a shell structure according to (9) and (10) with a permittivity varying from an outer boundary layer 6 of $\varepsilon_0 = 2.1$ (which may represent silica glass) to a value at the core radius 7 of $\varepsilon_c + i\gamma = 12 + 0.7i$ (which may represent n-doped silicon with the doping density $n \approx 2.7 \cdot 10^{20}$ cm$^{-3}$). The shell structure may be formed by such a glass glass-silicon composite material with an outer radius $R \approx 20$ μm and a core radius $R_c \approx 8.4$ μm.

The materials used may be metamaterials or other composite materials, or layers of conventional materials, or a combination thereof. Such materials may be, for example, concentric shells of materials having differing electromagnetic properties, or where the properties vary in a smooth or stepwise manner with radial distance. The scale size of the material variation may be greater than that of metamaterials for the shell thickness, for example, and the material properties may be homogeneous over a scale size greater than a wavelength. In the example of FIG. 3, the free-space wavelength of the incident radiation is $\lambda = 1.5$ μm.

There is excellent agreement between an exact calculation and the result from using a semiclassical theory. As such, the use of ray tracing and other approximations in designing structures may be appropriate. The shape of the structure may differ from that of a sphere or cylinder and the effect of such other shapes may be understood by numerical analysis. Moreover, the material electromagnetic properties and the spatial variation thereof need only generally approximate the theoretical results. The use of spheres and cylinders has been for computational convenience and not intended to be a limitation.

So as to provide further insight into the concepts, the same structures are evaluated by a direct solution of Maxwell's equations.

Consider the cylindrical version of the device, assuming that the system is infinite in the "axial" direction z (see FIG. 1B). When used to design a structure this would correspond to either (i) the length of the cylinder, $d \gg R \gg \lambda$, or (ii) the cylinder inside a single-mode waveguide system, where one may use the effective values of the permittivity, taking into account the waveguide mode structure. In this example, the TE and TM polarizations are decoupled and can be independently treated with nearly identical steps, so we will limit our analysis to the TE mode where the electric field $E = \hat{z}E$. Using the polar coordinates $(r, \phi)$ we introduce the "wavefunction" $\psi$ $$E(r, t) = \left(0, 0, \frac{1}{\sqrt{r}} \psi(r)\right) \exp(im\phi - i\omega t) \quad (11)$$

For $R_c < r < R$ the wave equation reduces to $$\psi'' + \frac{(k_0 R)^2 - m^2 + 1/4}{r^2} \psi = 0 \quad (12)$$

where the wavenumber $k_i = \sqrt{\varepsilon_0} \omega/c$. Equation 12 allows an analytical solution:

$$\psi(r) = A\sqrt{r}\cos\left(\sqrt{(k_0R)^2 - m^2}\,\log\frac{r}{R}\right) + \tag{13}$$

$$B\sqrt{r}\sin\left(\sqrt{(k_0R_c)^2 - m^2}\,\log\frac{r}{R_c}\right)$$

where A and B are constants defined by the boundary conditions at the "inner" ($r=R_c$) and "outer" ($r=R$) interfaces of the shell. In the core and outer regions where the permittivity is constant, the solutions of the wave equations reduce to the standard Bessel ($J_m$) and Hankel ($H_m^\pm \equiv J_m \pm iY_m$) functions $$E(r,\Phi,t) = \exp(im\Phi - i\omega t)$$

$$\times \begin{cases} CJ_m\left(\sqrt{\varepsilon_c + i\frac{\omega}{c}}\,r\right), & r < R_c, \\ H_m^-(k_0r) + r_m H_m^+(k_0r), & r > R. \end{cases} \tag{14}$$

where C is a constant and $r_m$ is the reflection coefficient for the angular momentum m. Note that only the Bessel function $J_m$ is present in the core region as $Y_m$ and $H_m$ diverge at the origin.

For the TE polarization that we consider, the boundary conditions for the electromagnetic field reduce to the continuity of $E(r,\phi)$ and the normal derivative thereof. Solving the resulting system of linear equations on A, B, C, and $r_m$ for the reflection coefficient:

$$r_m = -\frac{H_m^{-\prime}(k_0R) + \eta_m H_m^-(k_0R)}{H_m^{+\prime}(k_0R) + \eta_m H_m^+(k_0R)} \tag{15}$$

where $$\eta_m = -\frac{\sqrt{(k_0R)^2 - m^2}}{k_0R} \tag{16}$$

$$\tan\left[\sqrt{(k_0R)^2 - m^2}\,\log\frac{R}{R_c} - \arctan\left(\frac{pk_0R}{\sqrt{(k_0R)^2 - m^2}}\right)\frac{J_m'(pk_0R)}{J_m(pk_0R)}\right]$$

where $p = \sqrt{(\varepsilon_c + i\gamma)/\varepsilon_0}$.

For a given reflection coefficient in the angular momentum representation, the absorption cross section per unit length of a long cylinder is:

$$\sigma_a = \frac{1}{k_0}\sum_m |1 - |r_m|^2|^2 \tag{17}$$

Substituting (15) and (16) into (17), in the limit $k_0 \gg 1$, one obtains $$\sigma_a = 2R\left[1 - 2F\left(\frac{k_0R\gamma}{\varepsilon_c}\right) + F\left(\frac{2k_0R\gamma}{\varepsilon_c}\right)\right], \tag{18}$$

where $$F(x) = \int_0^{\pi/2} d\theta \cos\theta \exp(-x\cos\theta)$$

$$= \begin{cases} 1 - \frac{x}{2} + O(x^2), & x \ll 1, \\ \frac{1}{x^2} + O\left(\frac{1}{x^4}\right), & x \gg 1. \end{cases}$$

In the absence of losses (18) yields zero absorption cross-section, while for $k_0R\gamma \gg 1$, $\sigma_a$ is close to the full geometrical cross-section per unit length of the cylinder, 2R. Thus, as previously predicted by the semiclassical theory, the device does indeed capture all electromagnetic energy incident thereon from every direction. Furthermore, the effect is essentially nonresonant, leading to nearly perfect capture for an wide range of incident wavelengths, as long as the size of the structure is substantially larger than the free-space wavelength $\lambda_0$, and:

$$\sigma_a = 2R\left[1 - \frac{7}{4}\left(\frac{\varepsilon_c}{k_0R\gamma}\right)^2\right], \quad R\gamma \geq \lambda_0. \tag{19}$$

Thus, the structures are suitable for the capture (concentration) and absorption of electromagnetic energy (where absorption includes the transformation of the electromagnetic energy to an electrical signal or other energy form such as thermal) with nearly 100% efficiency. Such devices can find multiple applications in photovoltaics, solar energy harvesting, optoelectronics, omnidirectional sensors, and other applications where efficient collection or management of electromagnetic energy flows is desired.

Practical realizations of spherical or cylindrical optical and optoelectronic devices, or devices having more complex geometries, often involve a design that includes a number of layers. This is for convenience in fabrication, or to take advantage of specific material properties to achieve the desired spatial electromagnetic properties. Outer layers may be incorporated as a protective covering or for impedance matching, while an internal layer between the absorber (detector) and the inner shell surface of the optical concentrator may provide mechanical support as well as possible impedance matching. In a cylindrical configuration, a liquid may flow in the central core so as to absorb the incident energy and transfer the energy to other portions of a system through the ends of finite-length cylinders.

Figure 4:
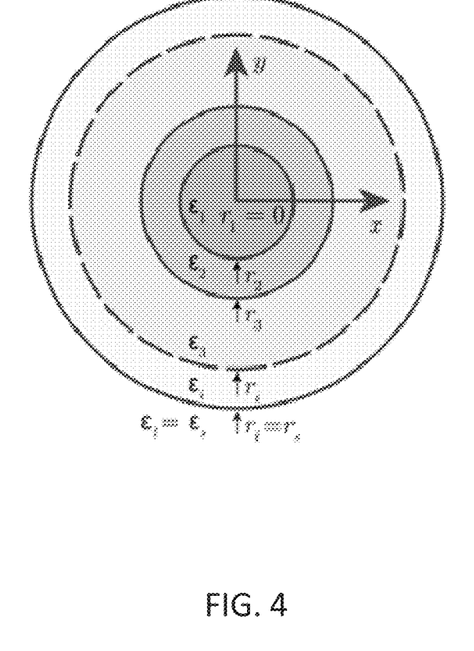
FIG. 4. shows the schematic geometry of a layered structure.

In an example, a concentric cylindrical device having l–1 layers, $r_i < r < r_{i+1}$, $i = \overline{1, l-1}$, with the "outer" ($r > r_s$) layer l is embedded in a host media, as shown in FIG. 4. That is, the permittivity of the outside medium is equal to that of the outermost layer of the shell. In this manner, reflections at the outer boundary are suppressed. In some embodiments, reflections at this interface are suppressed by an anti-reflection layer or coating.

Figure 5:
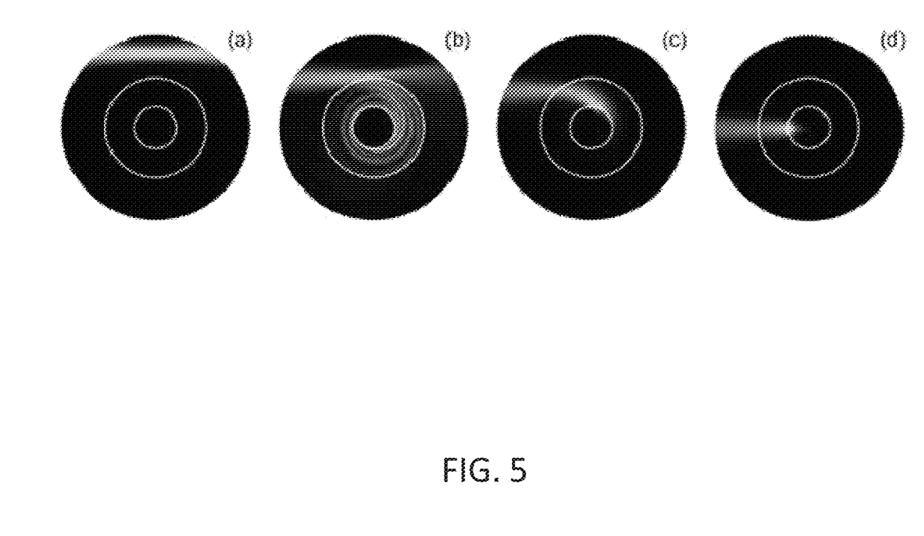
FIG. 5. Illustrates the effect of an Ideal black hole with $\epsilon_s=2.1$, $\epsilon_c=12$, $\gamma_c=0.7$, $r_s=20$ μm, and $r_c=r_s(\epsilon_s/\epsilon_c)^{1/2}=8.367$ μm on an incident Gaussian beam with free-space wavelength λ=1.5 μm and full width w=2λ is focused at $x_0=0$, and (A) $y_0=1.5r_s$; (B) $y_0=r_s$; (C) $y_0=0.75r_s$, and (D) $y_0=0$.

In an aspect, a simple (n=2) electromagnetic black hole may be a three-layered system with a radial gradient-index shell and an absorbing core, where the incident radiation is orthogonal to the cylinder axis. FIG. 5 shows an example full-wave simulation of an ideal black hole with $\varepsilon_s = 2.1$, $\varepsilon_c = 12$, $\gamma_c = 0.7$, $r_s = 20$ μm and $r_c = r_s(\varepsilon_s/\varepsilon_c)^{1/2} = 8.367$ μm. The structure is illuminated with a Gaussian beam (free-space wavelength $\lambda = 1.5$ μm and full width $w = 2\lambda$), which is focused at $x_0 = 0$, and (a) $y_0 = 1.5r_s$; (b) $y_0 = r_s$; (c) $y_0 = 0.75r_s$, and (d) $y_0 = 0$.

The formalism of a layered system can also be used to study a non-ideal lamellar "black hole" optical concentrator and absorber, which approximates the ideal device ($\epsilon_s=2.1$, $r_s=20$ μm, and $r_c=8.367$ μm) with a plurality of individually homogeneous layers. This example is presented to enable a person of skill in the art to make an initial choice of the number of layers that may be suitable for a particular application. Non-uniform thicknesses, variation of properties within a layer, and the like, will suggest themselves in particular applications, or for convenience in fabrication.

Figure 6:
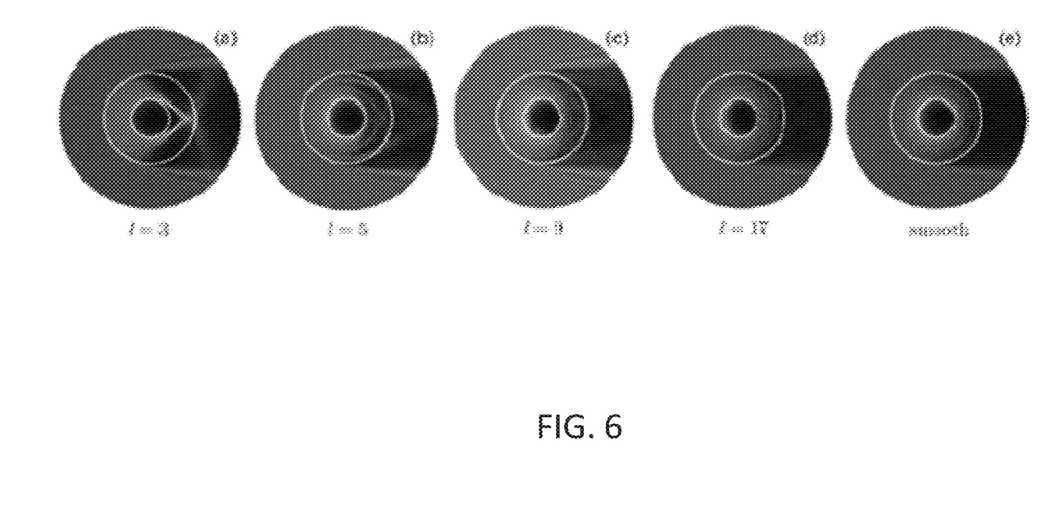
FIG. 6 shows simulated electromagnetic field maps for a lamellar "black hole" optical concentrator and absorber ($\epsilon_s=2.1$, $r_s=20$ μm, and $r_c=8.367$ μm) as a function of the total number of layers, l. The device is illuminated by a plane wave with free-space wavelength λ=1.5 μm. (A) l=3, and 72% absorption efficiency, (B) l=5, and 84% absorption efficiency, (C) l=9, and 90% absorption efficiency, (D) l=17, and 94% absorption efficiency; and (E) is the reference case of the ideal black hole with smooth gradient, and 99% absorption efficiency.

The device is illuminated by a plane wave with free-space wavelength λ=1.5 μm; for a system with 3, 5, 9, or 17 layers. The computed scattering and absorption efficiencies are 72%, 84%, 90%, and 94%, respectively, as shown in FIG. 6 A-D. FIG. 6E depicts the field map of the ideal black hole with smooth gradient, where 99% absorption efficiency is achieved.

Figure 7:
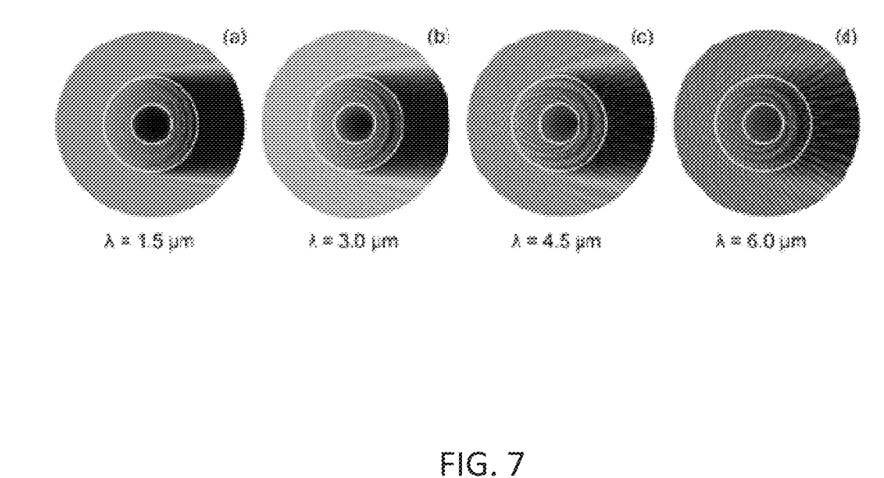
FIG. 7 shows simulated electromagnetic field maps of the black hole device ($\epsilon_s=2.1$, $r_s=20$ μm, and $r_c=8.367$ μm) illuminated by a TE-polarized plane wave with a free-space wavelength of (A) 1.5 μm, (B) 3.0 μm, (C) 4.5 μm, and (D) 6.0 μm.

To further illustrate the concept, FIG. 7 qualitatively portrays the effects on performance as one moves further away from the semiclassical limit. FIG. 7 shows field patterns of the device characterized by ($\epsilon_s=2.1$, $r_s=20$ μm, $r_c=8.367$ μm) and illuminated by a TE-polarized plane wave having free-space wavelengths between 1.5 and 6.0 μm, where increasing scattering is observed with increase of wavelength.

Figure 8:
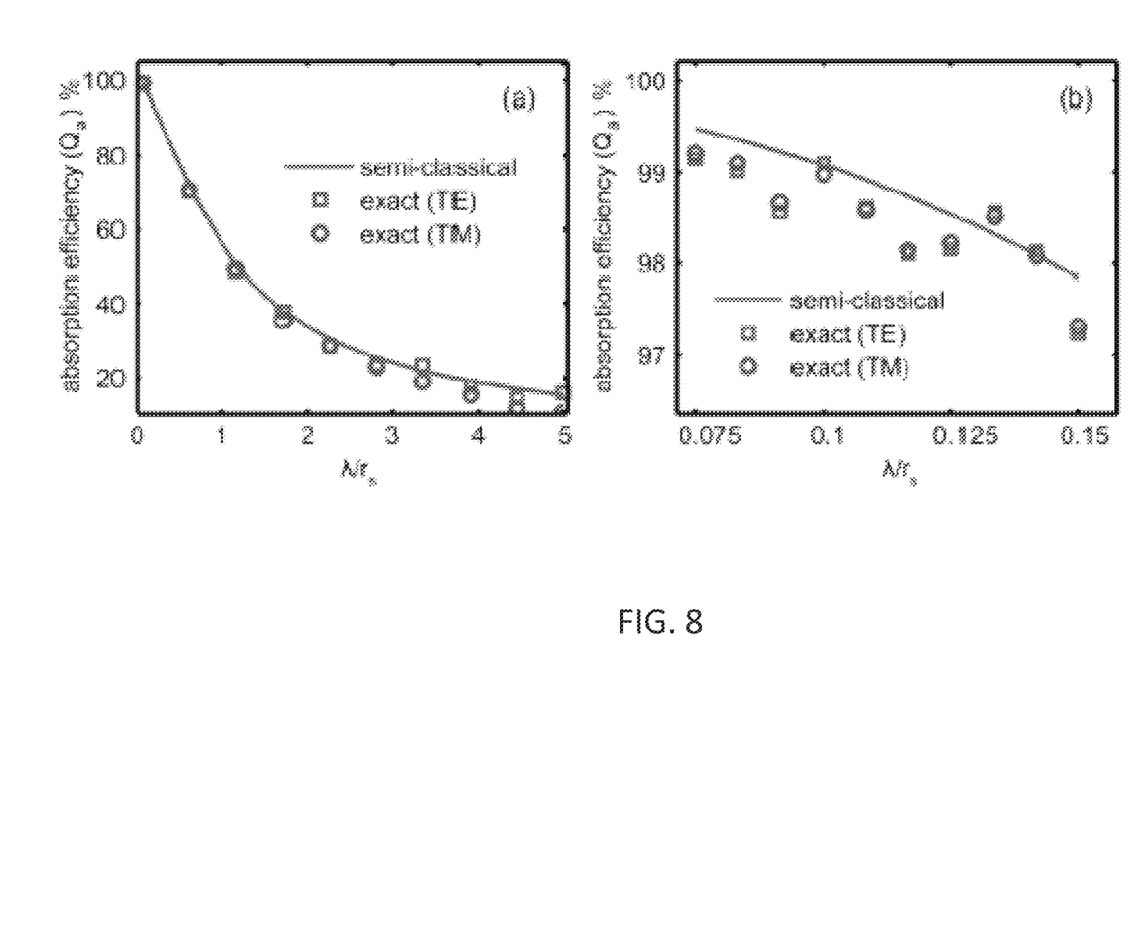
FIG. 8 shows (A) the absorption efficiency $Q_a$ vs. the ratio $\lambda/r_s$ obtained for the TE- and TM-polarized plane wave; and, (B) a more detailed plot for the ratios from 0.075 to 0.15; and, FIG. 9 shows an example of a planar solar panel having a plurality of solar cells with a black hole structure interposed between the solar cell and the energy source.

A quantitative comparison of the absorption efficiency, $Q^{abs}$, versus the ratio $\lambda/r_s$ is shown in FIG. 8A, and is separately calculated for the TE- and TM-polarized plane wave using the exact method described above, and for the and the semiclassical result, which is valid for both polarizations. FIG. 8A indicates the good quality of the semiclassical approximation of the absorption cross-section even far beyond the semiclassical limit. FIG. 8B shows a more detailed plot for $\lambda/r_s$ between 0.075 and 0.15.

The ability to accept electromagnetic energy over a wide range of incidence angles and over a broad spectrum of wavelengths may improve the performance of a variety of systems such as solar power generation, visible and infrared sensors, and the like.

Figure 9:
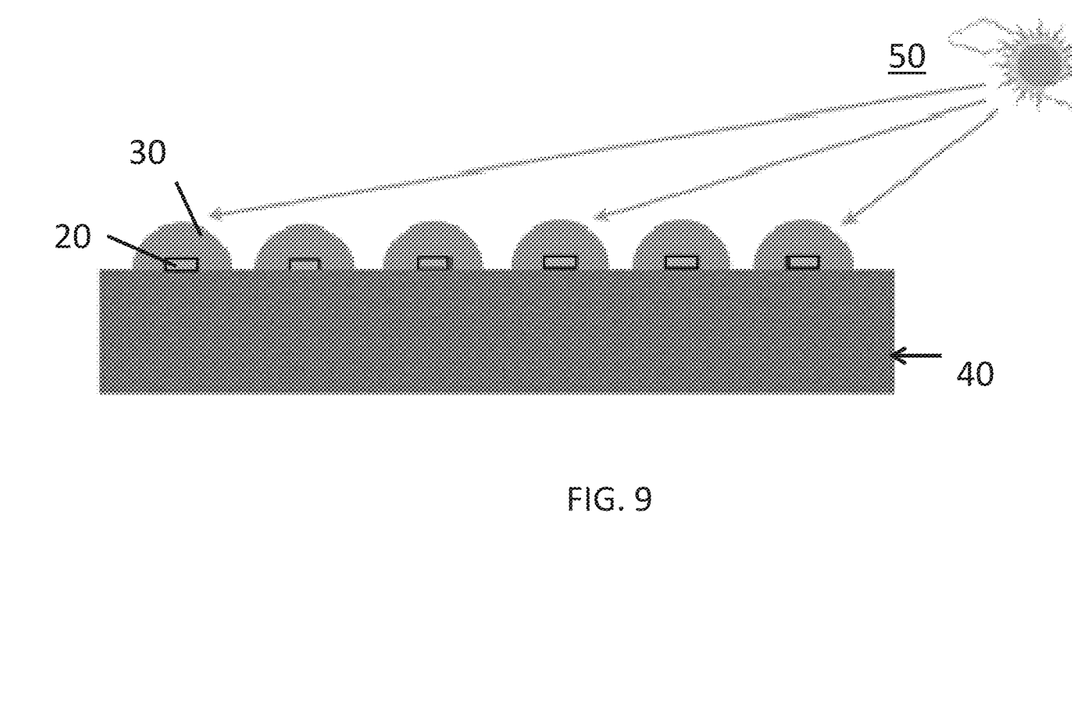

Solar cells are often planar devices, which may be overlaid with roughened surfaces, whiskered surfaces or microlenses so as to improve the coupling of the incident radiation to the photovoltaic cells. Even so, the effectiveness of most solar cells falls of markedly when the radiation is not normally incident on the surface thereof. This is in addition to the cosine effect of energy density. Fixed orientation solar cells may therefore be inefficient except for a small portion of the day. Solar cells that are mechanically orientated to face the sun require expensive mounts and maintenance. However, as shown in FIG. 9, a plurality of solar cells 20, overlaid by hemispherical or half-cylindrical "black hole" structure 30 would collect electromagnetic energy over a large range of incidence angles. That is, the solar energy 50 would enter the black hole and be directed onto the solar cells, which may be mounted to a substrate 40.

By concentrating the solar energy in this manner, the size of the solar cells can be reduced, while maintaining a capture area essentially equal to the planar extent of the array of black holes. In addition, solar energy that is scattered by clouds, reflected from the earth, and the like, and which is within the angular view of the array will likewise be directed to the solar cell. Not only does this mitigate the effects of scattering of the solar energy, but the total solar energy available is somewhat greater than that of the direct solar illumination itself.

In optical detectors using photodetectors, the background or "dark" noise is a function of the surface area of the detector. So, a concentrator that directs light from a wide range of angles onto a smaller area detector may improve the sensitivity of systems using photodetectors.

Some military systems are intended to detect the infrared radiation from hot bodies such as engines, and their exhausts, including jet and rocket exhausts. Often it is sufficient to detect the presence of the infrared emitter regardless of the angle of incidence of the radiation. So, for example, a spherical or hemispherical black hole directing the incident radiation onto the photodetector may increase the field-of-view of the detector, as well as the sensitivity of the system.

The example applications are not intended to be limiting as it will be apparent to a person of skill in the art that a variety of uses are possible. The black holes may be used singly, or arrayed as a plurality of black holes, and may be formed on a surface, where the surfaces may themselves be curved. In this context, a black hole may be a section of a simple structure which may be spherical or cylindrical; other shapes and variations may be designed, and such shapes may be chosen so as to facilitate the manufacture or deployment of the devices.

The structures may be entirely formed of solid materials, however, liquids, gels, and other materials may be used as material components thereof in order to take advantage of the material properties.

It is therefore intended that the foregoing detailed description be regarded as illustrative rather than limiting, and that it be understood that it is the following claims, including all equivalents, that are intended to define the spirit and scope of this invention.

What is claimed is:

1. A solar panel, comprising:
   a planar substrate;
   a plurality of solar cells mounted to the substrate; and
   a plurality of spherical section energy absorber structures mounted to the planar substrate and overlaying the solar cells, each of the plurality of solar cells disposed at the center of curvature of each of the plurality of spherical section energy absorber structures, the energy absorber structures comprising a material having a spatial variation of permittivity selected such that the change of the permittivity with a radial distance from the center of curvature of each of the plurality of spherical section structures is inversely proportional to at least the square of the radius of curvature of each of the plurality of spherical section energy absorber structures.

2. The solar panel of claim 1, wherein each of the plurality of spherical section energy absorber structures further comprises an impedance matching layer between the outermost portion of the material and a surrounding medium.

3. The solar panel of claim 2, wherein the surrounding medium is air.

4. The solar panel of claim 1, wherein spherical section energy absorber structures comprise a hemisphere.

5. The solar panel of claim 1, wherein the energy absorber structures are mounted on the substrate in an array formation.

6. The solar panel of claim 1, wherein the energy absorber structures comprise a solid material.

7. The solar panel of claim 1, wherein the energy absorber structures comprise glass.

8. The solar panel of claim 1, wherein the energy absorber structures comprise a composite material.

9. The solar panel of claim 8, wherein the composite material comprises glass and silicon.

10. The solar panel of claim 1, wherein the energy absorber structures comprise a metamaterial.

11. A method of manufacturing a solar panel, comprising:
providing a planar substrate;
mounting a plurality of solar cells to the substrate; and
mounting a plurality of spherical section energy absorber structures to the planar substrate and overlaying the solar cells, each of the plurality of solar cells disposed at the center of curvature of each of the plurality of spherical section energy absorber structures, the energy absorber structures comprising a material having a spatial variation of permittivity selected such that the change of the permittivity with a radial distance from the center of curvature of each of the plurality of spherical section structures is inversely proportional to at least the square of the radius of curvature of each of the plurality of spherical section energy absorber structures.

12. The method of claim 11, wherein each of the plurality of spherical section energy absorber structures further comprises an impedance matching layer between the outermost portion of the material and a surrounding medium.

13. The method of claim 12, wherein the surrounding medium is air.

14. The method of claim 11, wherein spherical section energy absorber structures comprise a hemisphere.

15. The method of claim 11, wherein the energy absorber structures are mounted on the substrate in an array formation.

16. The method of claim 11, wherein the energy absorber structures comprise a solid material.

17. The method of claim 11, wherein the energy absorber structures comprise glass.

18. The method of claim 11, wherein the energy absorber structures comprise a composite material.

19. The method of claim 18, wherein the composite material comprises glass and silicon.

20. The method of claim 11, wherein the energy absorber structures comprise a metamaterial.

* * * * *